Sept. 22, 1970 R. INGLESS ET AL 3,529,347

SEMICONDUCTOR DEVICES

Filed March 27, 1968

Inventors:
Ray Ingless
Norman Arthur Beaumont King
John Cecil Castle
and
Neville Charles Barber
BY
Baldwin Wight Diller & Brown
ATTORNEYS

United States Patent Office 3,529,347

Patented Sept. 22, 1970

3,529,347

SEMICONDUCTOR DEVICES

Roy Ingless, Chelmsford, Norman Arthur Beaumont King, Great Waltham, John Cecil Castle, Wokingham, and Neville Charles Barber, Braintree, England, assignors to The Marconi Company Limited, London, England, a British company Filed Mar. 27, 1968, Ser. No. 716,612

Claims priority, application Great Britain, Mar. 29, 1967, 14,335/67

Int. Cl. H01l *11/14, 7/66*

U.S. Cl. 29—571 8 Claims

ABSTRACT OF THE DISCLOSURE

In silicon semiconductor devices which undergo an oxidising process as part of their manufacture, undesirable electrical instability of the device results due, it is thought, to positive ion impurities. Most of these are removed by applying a thin layer of phosphorus glass over the oxide during manufacture. At high temperatures this layer acts as a "getter" for the positive ions but itself produces some electrical instability. This invention seeks to overcome this defect by removing the layer after a short high temperature "gettering" period and keeping the temperature low enough to avoid recontamination for the rest of the manufacturing process.

Figure 1:
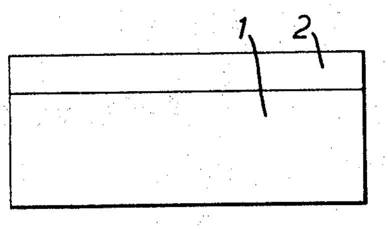

This invention relates to semiconductor devices of the kind which are made from silicon and which undergo an oxidising process at high temperature as part of the process of manufacture. One such device which will herein be used as an example to explain the present invention is known as a MOST (metal oxide silicon transistor).

An at present usual method of making a MOST will now be described with reference to FIGS. 1, 2, 3 and 4 of the accompanying drawings which are schematic cross-sectional views of a MOST at various stages in its construction. In the drawings like references denote like parts.

Referring to FIG. 1, this shows an n-type silicon "slice" 1 which has been oxidised at a high temperature to form an oxide layer 2 on its surface. By the term "high temperature" is herein meant a temperature sufficient to cause oxidation of the silicon and such a temperature will typically be about 1000° C.

Figure 2:
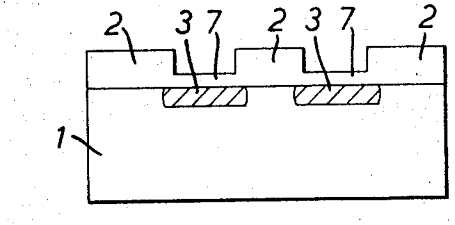
Figure 3:
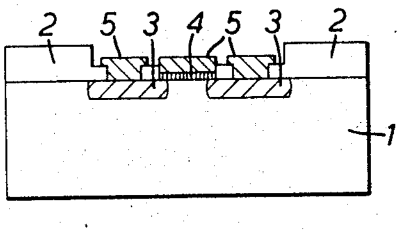

Referring to FIG. 2, a photolithographic and etching method known per se is used to cut "windows" in the oxide layer 2 and this step is followed by a boron deposition and diffusion process through the "windows," again at a high temperature, to form p-type source and drain regions 3. After diffusion a thin oxide layer 7 is grown over the diffused areas to close up the windows. A photolithographic method known per se is used to remove the central portion of the oxide layer 2 of FIG. 2 and this step is followed by re-oxidising, again at a high temperature, the thus exposed region of the silicon slice 1 to form a new and thinner oxide layer 4 over the channel region as shown in FIG. 3. A further photolithographic and etching operation is carried out to re-expose part of the source and drain regions 3 but leaving the central oxide gate insulating layer 4. Aluminium electrical contacts 5 may then be made, for example by evaporation, to the source, gate and drain regions of the device. Wires, not shown in FIG. 3 for reasons of clarity, may be welded to the aluminium contact areas 5.

Figure 4:
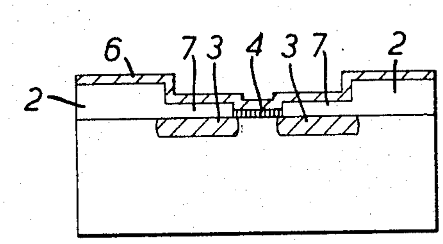

In practice devices made in accordance with the steps outlined above have often been found to possess electrical instabilities giving rise to excessive and undesirable junction leakage currents, and to variable, unpredictable and usually higher than desired "turn on" voltages. While the cause of this electrical instability is to some extent still obscure it is believed to be largely due to the introduction of positive ion impurities, usually of sodium, into the oxide layer of the device while it is being heated in the furnace. Whether this belief is correct or not experience has shown that improvement in the electrical stability of the device may be obtained by applying a layer of phosphorus glass on top of the oxide layer of the device before the aluminium contacts are formed. FIG. 4 of the accompanying drawings shows a device with a layer of phosphorus glass 6 on top of the oxide layers 2, 7 and 4. After opening contact windows to the source and drain diffused regions 3, aluminium contacts are positioned on the source and drain regions 3 and on the gate region 4 (the aluminium being evaporated onto the phosphorus glass layer 6 on top of the oxide layer 4 of course) but these are not shown in FIG. 4 for reasons of clarity. It is believed that the phosphorus glass layer 6 has a "gettering" effect by drawing out or removinug the unwanted positive ions from the oxide layer and that this is why instability is reduced. It is also believed to have the beneficial effects of preventing interaction between the aluminium contact layer 5 and the oxide layer 4 and of preventing migration through the oxide layers 2 and 4 of unwanted impurities. Although the provision as described of a layer of phosphorus glass does effect a marked improvement in the electrical stability of the device it is found that known devices with such a layer of phosphorus glass still exhibit an undesirably high degree of remaining instability. Careful experiment indicates that this remaining instability, which, though not very large, is a serious defect making the device unsuitable for many purposes, is actually due to the presence of the phosphorus glass itself acting as an impurity source. The present invention seeks to remove this defect and to provide improved and highly stable semiconductor devices of the kind referred to and this object is achieved, according to the invention, by, after a short high temperature heat treatment to allow gettering to take place, removing the phosphorus glass gettering material before applying the contacts and performing all steps of manufacture subsequent to such removal at a temperature below that at which recontamination by impurities will occur, and in a manner which precludes recontamination of the oxide.

According to a feature of this invention a method of making a silicon semiconductor device in which, during manufacture, oxide layering is formed at high temperature on selected areas of a silicon body, includes the steps of covering said oxide layering with layering of gettering material; heating to allow gettering to occur; removing said gettering material; and then applying contacts to the device; the application of said contacts and any other steps of manufacture subsequent to the removal of the gettering material being performed under such conditions and at a temperature below that at which recontamination by impurities will occur so as to substantially avoid recontamination of the oxide.

According to another feature of this invention a method of making a metal oxide silicon transistor includes the steps of forming, at a high temperature, source drain and gate regions with oxide layering thereon; removing the oxide layering from the source and drain regions; covering remaining oxide layering with a layering of gettering material; heating to allow gettering to occur; removing said gettering material; and applying contacts over the source drain and gate regions; the application of said contacts and any other steps of manufacture subsequent to the removal of the gettering material being performed under such conditions and at a temperature below that at which recontamination by impurities will occur so as to substantially avoid recontamination of the oxide.

Preferably, the gettering material is phosphorus glass ($P_2O_5SiO_2$). A practical thickness for the gettering material layer is of the order of 600 A.

The steps of manufacture performed subsequently to the removal of the gettering material should be performed at a temperature below 500° C. or thereabouts because, at temperatures materially above this, recontamination by impurities is liable to occur.

Preferably, the gettering material is removed by an etching process known per se.

Preferably, a small amount of the oxide layering beneath the gettering material is removed as well.

Preferably, the removal of the said gettering material is followed by thorough washing of the device in de-ionised water, followed by drying in a filtered nitrogen-gas stream. This is followed by a long low temperature—about 300° C.—heat treatment in dry nitrogen for 16 hours.

Devices made in accordance with this invention exhibit high stability as compared with known comparable devices. Leakage currents are not excessive and turn-on voltages are stable and of usefully low and predictable values.

FIGS. 1, 2, 3 and 4 already employed in connection with the description of the manufacture of a known MOST may also be utilised, and are so utilised, in the description which follows of the application of the present invention to the manufacture of an improved and highly stable MOST.

Referring to FIG. 1, a silicon "slice" 1 has an oxide layer 2 formed on its surface. In FIG. 2 "windows" are cut in the oxide layer 2 and p-type source and drain regions 3 formed by a boron deposition and diffusion process through the windows, which are subsequently closed by reoxidation to form thin oxide layers 7. The central portion of the oxide layer 2 of FIG. 2 is removed and the thus exposed region of the silicon slice 1 is reoxidised to form a new and thinner oxide layer 4 over the channel region as shown in FIG. 3. A layer of phosphorus glass 6 is next applied on top of the oxide layer of the device as shown in FIG. 4.

The steps so far outlined are of course exactly in accordance with the known method of making a MOST as previously described herein with reference to FIGS. 1, 2, 3 and 4. Part of the source and drain regions 3 are re-exposed in known manner by a photolithographic and etching operation to allow contacts to be made. At this stage the device is heat treated for about 30 minutes in an inert atmosphere at a high temperature, e.g. about 1000° C. In accordance with the invention the phosphorus glass layer 6 is etched away and, to make sure all the layer 6 is removed, the etching process is continued to remove a small amount, perhaps 100 A., of the oxide layers 2 and 4. The device is next thoroughly washed in de-ionised water, dried in a filtered nitrogen gas stream, and heat treated at low temperature in dry nitrogen for about 16 hours. Aluminium contacts 5 may then be evaporated on to the source and drain regions 3 and the channel region 4, any excess aluminium being removed by a suitable photolithographic and etching process, followed by thorough washing in de-ionised water, to produce the result shown in FIG. 3. The device is now thoroughly dried, at low temperature, over a period of about 16 hours.

The present invention is not of course limited in its application to the manufacture of MOSTS. It can, for example, be employed in the manufacture of so-called "n-channel" devices.

We claim:

1. A method of making a silicon semi-conductor device in which, during manufacture, oxide layering is formed at high temperature on selected areas of a silicon body including the steps of covering said oxide layering with layering of gettering material; heating to allow gettering to occur; removing said gettering material; and then applying contacts to the device; the application of said contacts and any other steps of manufacture subsequent to the removal of the gettering material being performed under such conditions and at a temperature below that at which recontamination by impurities will occur so as to substantially avoid recontamination of the oxide.

2. A method of making a metal oxide silicon transistor including the steps of forming, at a high temperature, source drain and gate regions with oxide layering thereon; removing the oxide layering from the source and drain regions; covering remaining oxide layering with a layering of gettering material; heating to allow gettering to occur; removing said gettering material; and applying contacts over the source drain and gate regions; the application of said contacts and any other steps of manufacture subsequent to the removal of the gettering material being performed under such conditions and at a temperature below that at which recontamination by impurities will occur so as to substantially avoid recontamination of the oxide.

3. A method according to claim 1 wherein the gettering material is phosphorus glass ($P_2O_5SiO_2$).

4. A method according to claim 3 wherein the thickness of the gettering material layer is of the order of 600 A.

5. A method according to claim 4 wherein the steps of manufacture performed subsequently to the removal of the gettering material are performed at a temperature below 500° C. or thereabouts.

6. A method according to claim 5 wherein the gettering material is removed by an atching process known per se.

7. A method according to claim 6 wherein a small amount of the oxide layering beneath the gettering material is removed as well as the gettering material.

8. A method according to claim 7 wherein the removal of the said gettering material is followed by thorough washing of the device in de-ionised water, followed by drying in a filtered nitrogen-gas stream by heat treatment in dry nitrogen for 16 hours at a temperature of approximately 300° C.

References Cited

UNITED STATES PATENTS

| | | |
|---|---|---|
| 3,343,254 | 9/1967 | Teuelde et al. |
| 3,387,358 | 6/1968 | Heiman. |
| 3,438,121 | 4/1969 | Wanass et al. |

OTHER REFERENCES

I.B.M. Technical Disclosure Bull., vol 12 No. 1, June 1969, p. 189, by L. U. Gregor.

PAUL M. COHEN, Primary Examiner

U.S. Cl. X.R.

29—576, 578; 317—235